United States Patent [19]

Kwapisz

[11] Patent Number: 4,959,784

[45] Date of Patent: Sep. 25, 1990

[54] METHOD AND SYSTEM FOR ADJUSTING RELAY ARMATURES

[75] Inventor: Steven J. Kwapisz, Madison Heights, Mich.

[73] Assignee: United Technologies Automotive, Dearborn, Mich.

[21] Appl. No.: 413,668

[22] Filed: Sep. 28, 1989

[51] Int. Cl.[5] .............................................. G01R 31/32

[52] U.S. Cl. .................................... 324/418; 29/602.1; 324/202; 324/601; 335/86

[58] Field of Search ............... 324/418, 423, 422, 415, 324/207.11, 207.12, 202, 601; 361/187; 335/86, 144; 29/602.1, 622

[56] References Cited

U.S. PATENT DOCUMENTS

| | | | |
|---|---|---|---|
| 2,940,036 | 6/1960 | Weeks | 324/423 |
| 3,480,833 | 11/1969 | Allen | 324/418 X |
| 3,510,759 | 5/1970 | Nador | 324/423 |
| 4,319,193 | 3/1982 | Boccali et al. | 324/418 |
| 4,669,182 | 6/1987 | Ferroni et al. | 29/622 |

*Primary Examiner*—Reinhard J. Eisenzopf
*Assistant Examiner*—Robert W. Mueller
*Attorney, Agent, or Firm*—Troxell K. Snyder; Marshall E. Rosenberg

[57] ABSTRACT

A method and system (1) for adjusting the curvature of an electrical relay armature (4), and the energizing voltage level of the electrical relay (2) in which it is contained, is disclosed. The adjustment system (1) uses a rotatable carrier (16) from which an extendable cam (22) with a shaped bearing surface (23) directly communicates with, and provides necessary adjustment to, a curved armature section (8) of a misconfigured relay armature (4). The necessary adjustment is determined and controlled by a controller in combination with an energizing level determining device.

7 Claims, 3 Drawing Sheets

METHOD AND SYSTEM FOR ADJUSTING RELAY ARMATURES

FIELD OF THE INVENTION

This invention relates generally to electromechanical relays, and more particularly to means for adjusting the physical configuration of relay armatures contained therein to enable operation of the relay within a preselected energizing voltage range.

BACKGROUND OF THE INVENTION

An electromechanical relay is a device operated by variations in its electrical input and which, in turn, operates or controls devices connected to its output. Relays are used in a wide variety of industrial applications, including digital computers, telephone exchanges, and motor controls, such as those extensively used in the automotive industry.

One such means of operation or control by a relay is the initiation and termination of electrical current flow in response to variations in circuit voltage. A change of voltage results in the change of the magnetic flux of the relay coil, resulting in a magnetic attraction, and physical relocation, of a movable relay armature, to which a metal contact is attached. The activated relay armature moves a distance sufficient to allow its attached contact to bear on another electrical conductor, resulting in an electrical connection. It is therefore important that the relay respond within the preselected voltage range in order for the relay to properly affect the necessary circuitry.

Specifically, the geometric configuration of a relay's armature is critical to its performance. The armature used in a relay may be formed with a bend or a plurality of bends at precise locations along its length. Thus, the bends contributing to the armature's configuration are geometrically designed to provide a spring action which allows for the required switching action upon application of voltage in a preselected energizing voltage range.

An important problem is verification and correction of the angular position of the free end of an armature in relation to its fixed end after assembly of the relay and prior to operation of the mechanism in which the relay is installed because incorrect positioning of the armature adversely affects the energizing voltage level of the relay. Because relay armatures are generally formed from soft metals, such as copper alloys, they are highly susceptible to performance-critical alteration of their configurations due to even routine handling procedures. In most cases, misconfiguration of these relay armatures is visually undetectable, the imperfection becoming apparent only after installation, and failure, of the completed relay in its host mechanism.

What is needed is a new method and system for adjusting the relay armatures utilized in electromechanical relays.

SUMMARY OF THE INVENTION

It is thus an object of the present invention to provide a method and system for reconfiguring the resilient armatures utilized in electromechanical relays.

This and other objects will become apparent in the further course of this disclosure.

The present invention provides a system and a method that adjusts the physical configuration of the electrical relay armature of an electromechanical relay, and the spring constant of the armature, to provide required electrical operation upon imposition of a voltage in a preselected voltage range. This is accomplished through the use of an eccentrically-mounted cam which bears against a misconfigured armature through a predetermined rotation of the cam. Adjustment of the armature is conducted and then checked through an energizing voltage level test operated in combination with a controller. The eccentrically-mounted cam can be applied to misconfigured armatures to correct over- and underenergizing levels of the relay.

Energizing levels of a relay can be checked, and if necessary, corrected, before installation in a designated apparatus, according to the present invention. Tighter control of a relay's operating envelope should therefore result in fewer electrical or electrically-induced complications, malfunctions, and failures.

DETAILED DISCLOSURE

Figure 1:
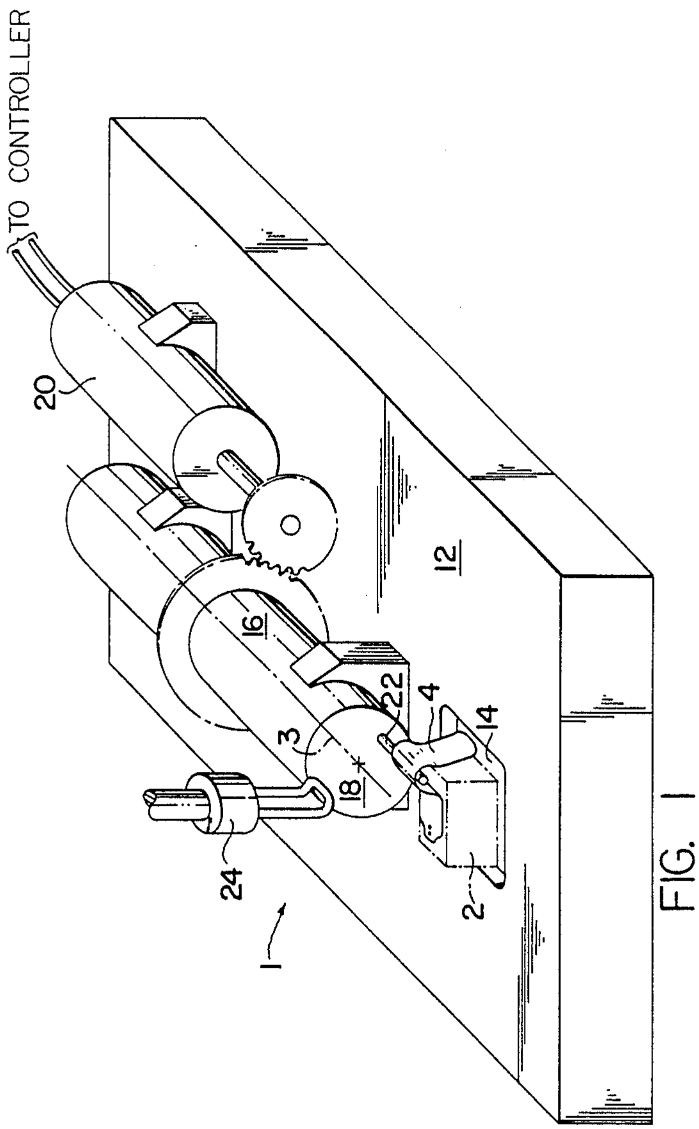
FIG. 1 is a perspective view of an electrical relay armature adjusting system.
Figure 3:
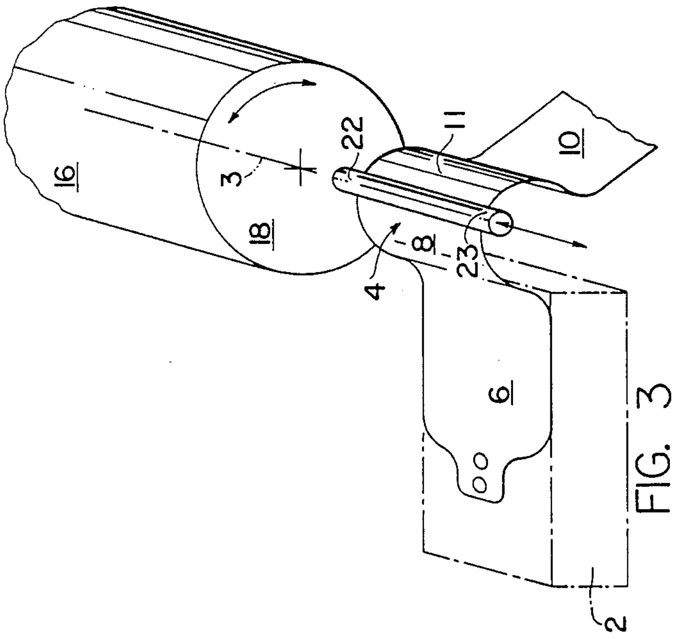
FIG. 3 is an enlarged perspective view of the adjusting system showing the adjusting cam extended from the cylinder face in a reference position relative to a relay which energizes below a preselected energizing range, ready for adjustment of the relay armature.
Figure 2:
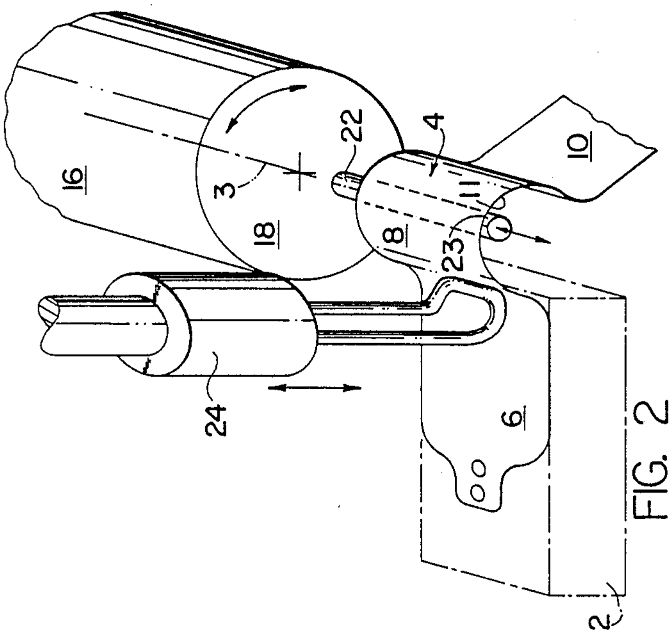
FIG. 2 is an enlarged perspective view of the adjusting system showing an adjusting cam extended from a cylinder face in a reference position relative to a relay which energizes above a preselected energizing range, ready for adjustment of the relay armature.

FIG. 1 diagrammatically represents an electrical relay armature adjusting system 1 for adjusting the curvature of a relay armature 4 contained in an electromechanical relay 2 so that the relay 2 will energize within a desired voltage range and provide a required switching action. The relay armature 4 comprises a tab section 6 affixed to the frame of the relay, a resilient curved armature section 8, and a movable armature section 10, as shown in FIGS. 2, 3. The adjusting system 1 operates in combination with a controller (not shown) and a relay test fixture 12 which measures the relay's energizing voltage level. An electrical measuring device, such as a voltmeter, may be used for this purpose. The controller then compares the resulting measured energizing voltage level with the preselected energizing voltage range. A measured deviation from the preselected energizing voltage range will result in a corresponding adjustment of the relay armature 4, as determined by the controller.

The controller has means to determine current and voltage within the tested circuitry and to sense the energizing level of the relay 2, as is well known in the art. Specifically, the voltage may be ramped up to the relay's energizing level, causing the relay's armature 4 to move to an energized position, resulting in a switching action. The controller then makes additional decisions based on this information regarding necessary armature adjustment after comparing the present energizing level with a preselected energizing range.

The adjusting system 1 is responsive to a measured energizing level, and the necessary adjustment is then made to the curvature of the relay armature 4 to increase or decrease the energizing level of the relay 2. That is, adjustment of the movable relay armature 4 results in a reconfiguring of the relay armature in relation to an electrical conductor with which electrical communication is selectively desirable.

Adjustment of the relay armature 4 is accomplished by rotating a carrier 16 through a predetermined arc, with a shaped surface 23 of an extendable cam 22 impacting a broad side 11 of the relay armature 4 through a portion of the arc, thus accomplishing a deflection, and desired adjustment, of the relay armature 4. The deflection of the armature 4 by the cam 22 can be sufficient to cause a plastic deformation and reconfiguring of relay armature 4, which results in an adjustment of the spring rate of the relay armature 4.

The adjusting system 1 includes the carrier 16 which contains the cam 22. This cam 22 is extendable from a carrier face 18, the cam's line of action being parallel to, but displaced from, the carrier's axis of rotation 3. A stepper motor 20 imparts selectable rotary motion to the carrier 16, and hence, the cam 22 contained therein. This rotary motion is utilized by the system 1 to adjust the relay armature 4.

Figure 4:
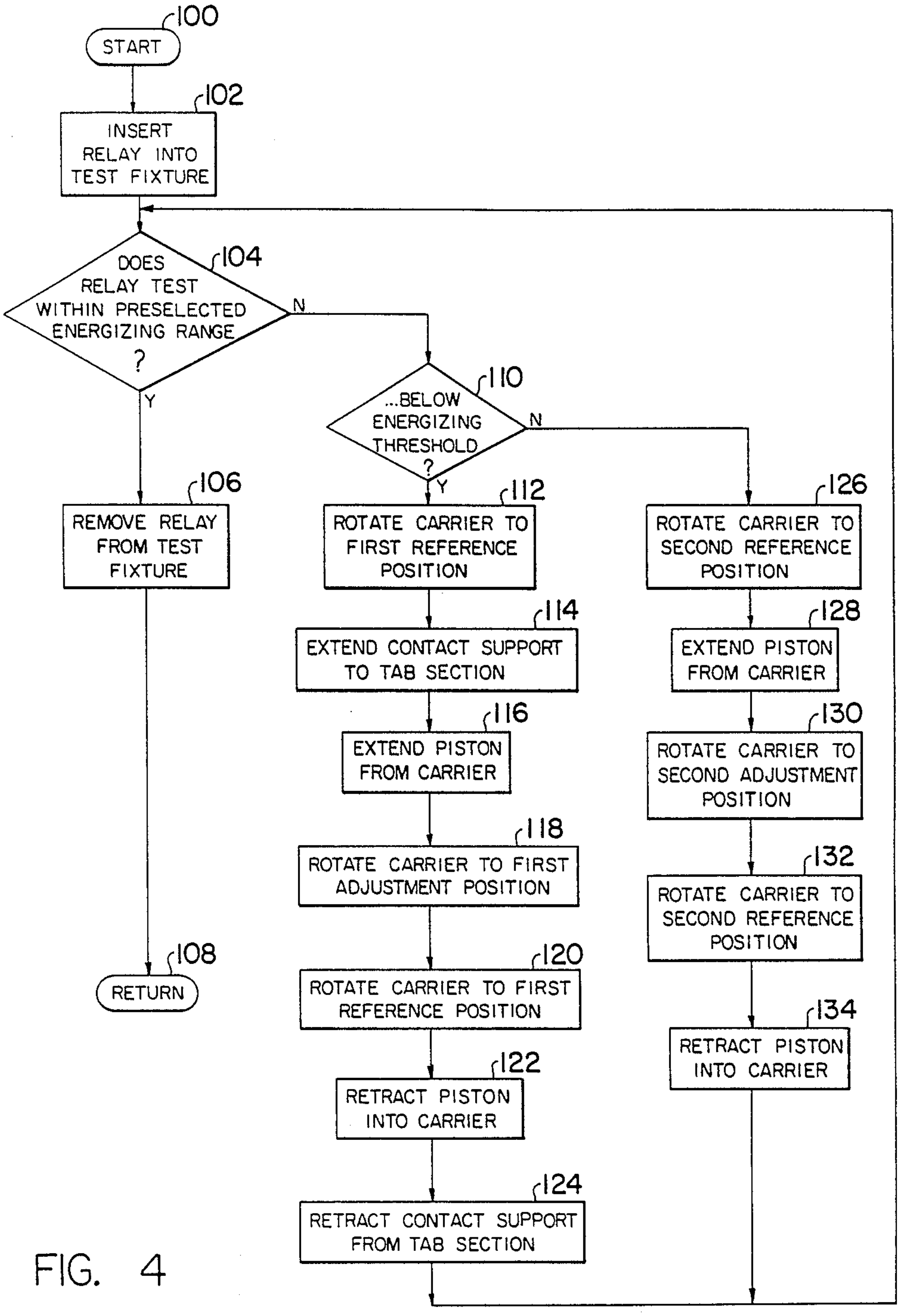
FIG. 4 is a flow chart indicating a method for adjusting an electrical relay armature.

The carrier 16 is actuated by the controller according to the method flowchart of FIG. 4. The mechanical portion of the relay armature adjustment procedure begins when the shaped surface 23 of the extended cam 22 is brought to bear on the relay armature 4 at an initial reference position (steps 112, 126 of FIG. 4). The extended cam 22 then follows through the arc predetermined by the controller, the shaped surface 23 of the extended cam 22 plastically deforming the armature material, resulting in the reconfiguring of the relay armature 4.

The controller is used in combination with the adjusting system 1 to determine the energizing level of the relay 2 and to provide the information needed for the operation of the adjusting system 1 to accomplish adjustment of the relay armature 4. After installation of the relay 2 in the mounting cavity 14 of the test fixture 12, the subject relay 2 is energized to determine the threshold voltage at which its relay armature 4 responds. The controller compares this data with a predetermined electrical performance range, the controller then determining the amount of adjustment needed by the relay armature 4, if any, for the required operation of the relay 2. The calculation of the angle of rotation of the carrier 16 necessary for the reconfiguration of the relay armature 4 of a relay 2 with a deviant energizing voltage level requires the inputting of a plurality of variables to the controller, including but not limited to armature composition, armature thickness, measured energizing voltage level, and the desired voltage energizing range of the relay 2, and such calculation can be performed by those skilled in the art. The controller then initiates and completes the sequencing of the components of the adjusting system 1 if adjustment of the relay armature 4 is required. The relay 2 is then retested to verify compliance of the newly adjusted relay armature 4 within the required energizing range. If the newly adjusted relay energizes within the required energizing range, then it is removed from the system 1.

FIGS. 2 and 3 refer to a more detailed perspective view of two possible configurations of the adjusting system 1 in relation to a relay armature 4. The adjusting system 1 can operate in these configurations to change the radius of curvature of the curved armature section 8, thus altering the energizing level of the relay 2. Increasing the radius of curvature of the curved armature section 8 increases the threshold voltage level required to energize the relay. Conversely, decreasing the radius of curvature of the curved armature section 8 decreases the energizing voltage level.

According to FIG. 4, after the relay 2 is installed in the mounting cavity 14 of the test fixture 12, the relay 2 is energized and tested to determine its threshold energizing level, as indicated in step 104. If the relay 2 energizes outside of a preselected voltage range, then adjustment of the relay's armature is indicated. The controller will then proceed with an appropriate armature adjustment program, depending on the type of adjustment required, as decided at step 110.

Specifically, an electromechanical relay 2 is inserted into the relay armature adjusting system 1, according to step 102 of FIG. 4. The energizing voltage level of the relay 2 is then checked, according to step 104. If the relay 2 is found to energize below the preselected energizing voltage range, then steps 112–124 of FIG. 4 are sequentially followed to measurably adjust the relay armature 4. If the relay 2 is found to energize above the preselected energizing voltage range, then steps 126–134 of FIG. 4 are sequentially followed to measurably adjust the relay armature 4. In either case, the adjusted relay 2 is rechecked to determine whether it energizes within the preselected energizing voltage range. If the readjusted relay 4 energizes within the preselected voltage range, then it is removed from the test fixture, according to step 106 of FIG. 4.

According to FIG. 2, increasing the energizing level of a relay 2 is accomplished by increasing the radius of curvature of the curved armature section 8 by rotating the cam 4 against the inner surface 11 of the relay armature 4 a predetermined angle, causing a predetermined plastic deformation of the relay armature 4. Procedurally, the relay 2 is installed in the fixture 12 and is electrically tested. When it has been determined that the relay is under-energizing, then steps 112–124 of FIG. 4 are conducted, followed by a retesting of the relay's energizing level, according to step 104.

The relay armature support 24 provides an important function in the physical reconfiguration of an underenergizing relay 2. When the relay armature support 24 is extended to the tab section 6 of the relay armature 4, it counteracts shearing forces resulting from the application of the extended cam 22 to the curved armature section 8 of the relay armature 4 when the carrier 18 rotates in a clockwise manner from an initial reference position proximate to the tab section 6 to a more distant position on the curved armature section 8 relative to the tab section 6. The tab section 6 is that portion of the relay armature 4 which is directly affixed to the frame of the relay 2, and with which it makes a direct electrical connection. The armature support 24 is imposed against the tab section 6, wherein the tab section 6 is that portion of the relay armature 4 that provides direct mechanical and electrical contact with the relay 2. The relay armature support 24 may be moved between retracted and extended positions by a pressurized air mechanism (not shown).

According to FIG. 3, decreasing the energizing level of the relay 2 is accomplished by decreasing the radius of curvature of the curved armature section 8 by rotating the cam 22 against the outer surface 11 of the relay armature 4 through a predetermined angle, causing a predetermined plastic deformation of the relay armature 4. Procedurally, the relay 2 is installed in the fixture 12 and is electrically tested. When it has been determined that the relay is over-energizing, then steps 126–134 of FIG. 4 are to be conducted, followed by a retesting of the relay's energizing level, according to step 104.

Alternatively, adjustment of the relay's energizing level by reconfiguring the relay armature 4 may be described as utilizing the adjusting system 1 to alter the spring constant of the curved section 8 of the relay armature 4, resulting in the alteration of the energizing level at which the armature 4 reacts upon energization of the electrical relay 2.

The controller is programmed to provide a relay armature adjusting procedure when the energizing level of a given relay 2 is determined to be unacceptable. The automotive industry typically designs relays to operate between 4 and 7 volts (d.c.). A more precise operating range is determined by the actual electrical relay armature material and the relay's armature thickness. The typical electrical relay armature material is a beryllium-copper alloy, and the typical thickness of the relay armature is between 0.008 and 0.010 inch. These characteristics of electromechanical relay armatures are well known in the art.

A complete cycle of the present invention, excluding the time required to load the relay 2 into the test fixture 12, can be completed within ten seconds.

Further modifications and improvements of the invention herein disclosed will occur to those skilled in the respective arts and all such modifications and improvements are deemed to be within the scope of the invention as defined by the appended claims.

I claim:

1. A system for adjusting the curvature of an electrical relay armature in an electrical relay, wherein the system determines the adjustment necessary for the required electrical operation of the electrical relay in a preselected voltage range based on a comparison of the electrical relay's actual energizing voltage with the preselected energizing voltage range, comprising:

a rotatable carrier, a cam supported by the carrier, rotation of the carrier causing the cam to strike the relay armature at a predetermined location, resulting in a precalculated permanent deformation to the relay armature, means for rotating the carrier, means for supporting the relay armature during adjustment thereof, means for determining the electrical relay energizing voltage, and means, responsive to the determined electrical relay energizing voltage, for controlling the carrier rotating means.

2. The system as claimed in claim 1, wherein the cam is extendable, responsive to the controlling means, along a line of action parallel to the carrier's axis of rotation.

3. The system as claimed in claim 1, wherein a shaped contact surface is lengthwise disposed on the cam, said surface being parallel to, but spaced from, the carrier's axis of rotation.

4. The system as claimed in claim 1, wherein a cylindrical contact surface is lengthwise disposed on the cam, said surface being parallel to, but spaced from, the carrier's axis of rotation.

5. The system as claimed in claim 1, wherein the supporting means is extendably responsive to the controlling means.

6. The system as claimed in claim 1, wherein the relay armature is conductive and serves also as an electrical contact.

7. A method of adjusting an electrical relay armature for the required operation of an electrical relay, comprising the sequential steps of:

(a) inserting the electrical relay into a relay test fixture;

(b) determining the electrical relay's energizing voltage level;

(c) removing the electrical relay from the test fixture if the relay energizing level is within a preselected range;

(d) rotating a carrier, which is in spaced relationship with the relay test fixture, to a first reference position determined by the controller if the step of determining the electrical relay energizing level indicates an energizing level above a maximum energizing level, further performing the steps of:

extending a cam from the carrier, rotating the carrier to a first adjustment position, a shaped side of the cam impacting the relay armature, rotating the carrier back to the first initial reference position, retracting the cam into the carrier, and repeating steps (b) and (c);

(e) rotating the carrier, which is in spaced relationship with the relay test fixture, to a second reference position determined by the controller if the energizing test indicates electrical performance below a minimum energizing level, further performing the steps of:

applying a relay armature support to a tab section of the relay armature, said tab section in communication with the frame of the relay, extending a cam from the carrier, rotating the carrier to a second adjustment position, a shaped side of the cam impacting the relay armature, rotating the carrier back to the second initial reference position, retracting the cam into the carrier, retracting the relay armature support from the tab section of the relay armature, and repeating steps (b) and (c).

* * * * *